United States Patent [19]

Takahashi et al.

[11] Patent Number: 4,540,909
[45] Date of Patent: Sep. 10, 1985

[54] TUNING FORK TYPE QUARTZ CRYSTAL RESONATOR WITH VARIABLE WIDTH BASE

[75] Inventors: Kunihiro Takahashi; Nobuyoshi Matsuyama, both of Tokyo, Japan

[73] Assignee: Seiko Instruments & Electronics Ltd., Tokyo, Japan

[21] Appl. No.: 594,536

[22] Filed: Mar. 29, 1984

[30] Foreign Application Priority Data

Apr. 4, 1983 [JP] Japan ................................ 58-59018
May 25, 1983 [JP] Japan ................................ 58-92059

[51] Int. Cl.³ ............................................. H01L 41/08
[52] U.S. Cl. ..................................... 310/370; 310/361
[58] Field of Search ............... 310/370, 360, 361, 367, 310/368, 366

[56] References Cited

U.S. PATENT DOCUMENTS

Re. 29,429 10/1977 Kawai et al. .................. 310/370 X
3,683,213 8/1972 Staudte ........................... 310/370 X
4,320,320 3/1982 Momosaki et al. ............. 310/370 X
4,377,765 3/1983 Kogure et al. .................. 310/370 X
4,410,827 10/1983 Kogure ............................. 310/370

FOREIGN PATENT DOCUMENTS 52-1986 5/1977 Japan ................................ 310/370
56-4813 7/1981 Japan ................................ 310/370

Primary Examiner—Mark O. Budd
Attorney, Agent, or Firm—Robert E. Burns; Emmanuel J. Lobato; Bruce L. Adams

[57] ABSTRACT

A tuning fork type quartz crystal resonator using a coupling between the fundamental flexural and fundamental torsional modes of vibration. The resonator has a base and two tuning fork arms extending from the base. The length of the base is larger than that of the tuning fork arms. The base has a narrow width portion effective to lower the vibrating displacements of the base end according to the torsional mode.

25 Claims, 20 Drawing Figures

TUNING FORK TYPE QUARTZ CRYSTAL RESONATOR WITH VARIABLE WIDTH BASE

BACKGROUND OF THE INVENTION

The present invention relates to a tuning fork type quartz crystal resonator using a coupling between the fundamental flexural and fundamental torsional modes of vibration, and more particularly to the shape, size and cutting angle of the quartz crystal resonator.

Recently, a tuning fork type quartz crystal resonator having a favorable favorable frequency-temperature characteristic (hereinafter referred to as f-T characteristic) by utilizing the coupling between the flexural and torsional modes has received much attention. This kind of resonator has a very excellent f-T characteristic compared with ordinary resonators which are used for watches at the present time. The accuracy of ordinary watches is a monthly rate of less than about 10 seconds or less than about 15 seconds. On the other hand, the accuracy of watches having a resonator using coupling between the flexural and torsional modes may be yearly rate of less than 10 seconds.

In order to utilize the coupling between the flexural and torsional modes of the tuning fork type quartz crystal resonator, a method utilizing the coupling between the secondary flexural mode (hereinafter referred to as F2) and the fundamental torsional mode (hereinafter referred to as T1) has been adopted. According to this method utilizing F2, it is possible to minimize the $R_1$ of the resonator. An example of such resonator utilizing the coupling between F2 and T1 is shown in U.S. Pat. No. 4,377,765.

However, by utilizing the coupling between the fundamental flexural mode (hereinafter referred to as F1) and T1, the size and the volume of the resonator may be smaller than those of the resonator utilizing the coupling between F2 and T1 and vibrating with the same frequency. Utilizing the coupling between F1 and T1 is advantageous for minimization of resonator.

Figure 1:
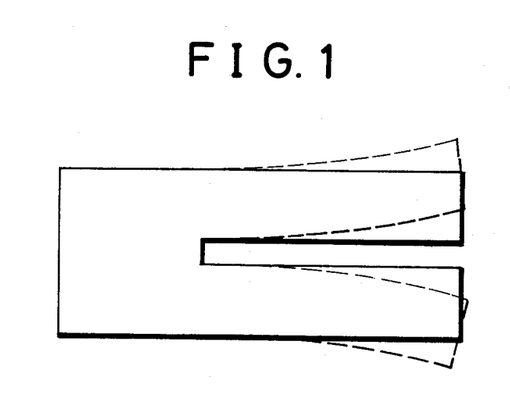
FIG. 1 is a plan view of a tuning fork type quartz crystal resonator showing the vibrating displacements of the fundamental flexural mode.
Figure 2:
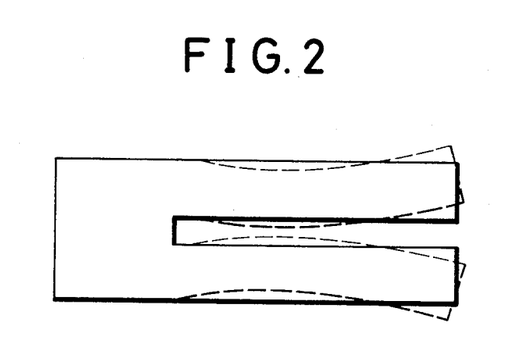
FIG. 2 is a plan view of a tuning fork type quartz crystal resonator showing the vibrating displacements of the secondary flexural mode.

The vibrating displacements of F1 and F2 are respectively shown in FIG. 1 and FIG. 2 by broken lines.

Figure 3:
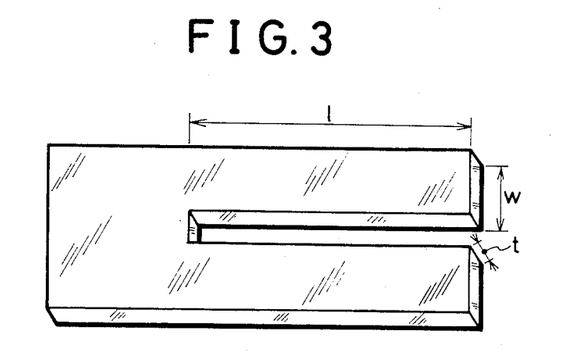
FIG. 3 is a perspective view of a tuning fork type quartz crystal resonator showing an external shape.

The reason why the reasonator utilizing F1 may be small is explained as follows. The frequency $f_F$ of the flexural mode (hereinafter referred to as $f_F$) and the frequency $f_T$ of the torsional mode (hereinafter referred to as $f_T$) may be expressed as follows:

$$f_F = C_F w / l^2 \qquad (1)$$

$$f_T = C_T t / (lw) \qquad (2)$$

where; $C_F$ and $C_T$ are constants, respectively, t is the thickness of the resonator, and l and w are the length and width of the tuning fork arms respectively as shown in FIG. 3.

In the case of two tuning fork type quartz crystal resonators having the same shapes, the frequency of F2 is about 6 times the frequency of F1. Therefore, in order to obtain a fundamental flexural mode with a frequency equal to that of a secondary flexural mode, it is necessary to make w larger or to make l smaller in comparison with that of the secondary flexural mode resonator. In making w larger, it is difficult to take the reasonator to fit in the limited space of a housing. Therefore, making l smaller is the method generally used. In this case, so as to obtain F1 with a frequency equal to that of F2, the length of the tuning fork should equal to about 40% of that in case of the secondary flexural mode.

In order to utilize the coupling between the flexural and torsional modes, it is necessary to bring $f_T$ close to $f_F$. The condition relative to $f_F$ and $f_T$ for the resonator having an excellent f-T characteristic which may be used for a yearly-rate-accuracy watch may be practically expressed as follows:

$$(f_F - f_T)/f_F = 0.02 \sim 0.05 \qquad (3)$$

Therefore, in the case of utilizing the coupling between F1 and T1, so as to satisfy the equation (3), it is necessary to make l smaller in comparison with the case of utilizing the coupling between F2 and T1, so that the thickness t must be made smaller. Consequently by utilizing the coupling between F1 and T1, the volume of the resonator is extremely smaller than that in the case of utilizing the coupling between F2 and T1.

If the tuning fork type quartz crystal resonator is produced by photolithography, to make the resonator thin results in a shortening of the etching time for the quartz crystal. As described above, utilizing the coupling between F1 and T1 minimizes the size of the resonator. Furthermore, it is possible to produce the resonator in a short time by utilizing photolithography, so that it is advantageous for reducing the manufacturing cost.

Figure 4:
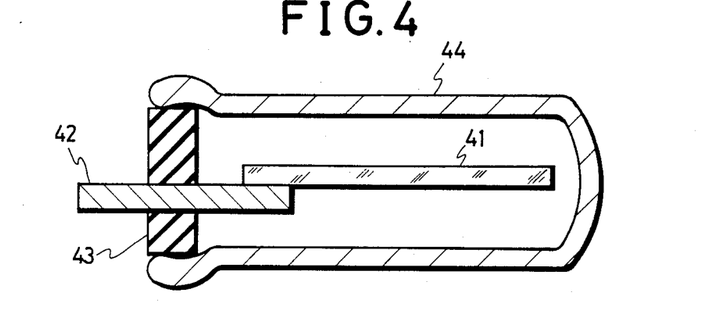
FIG. 4 is a side elevation of a tuning fork type quartz crystal resonator and a housing.

Utilizing the coupling between F1 and T1, as the length l of the tuning fork becomes shorter, the whole length of the resonator becomes shorter too. Therefore, the vibrating displacements of the flexural and torsional modes in the end region of the base which is the portion for supporting the resonator are apt to enlarge. The term "base" refers to the portion of the resonator except the two tuning fork arms. The large vibrating displacement causes a vibration leakage by the vibration of the resonator 41 transmitted to a housing 44 through lead terminals 42 and a plug 43 shown in FIG. 4. If the vibration leakage is large, the Q value of the resonator becomes lower and the $R_1$ becomes higher, so that a stable frequency-temperature characteristic or a stable frequency-aging characteristic may not be obtained.

Conventionally, in the case of the tuning fork type quartz crystal resonator utilizing the coupling between the flexural and torsional modes, it has been found that the resonator having a cutting angle effective to get an excellent f-T characteristic which may be used for a yearly-rate-accuracy watch may be obtained by rotating the Z plane in the range of $-15°$ to $0°$ with the counterclockwise direction of rotation around the electrical axis (x axis) of the quartz crystal being defined as a positive angle, where the Z plane means the plane perpendicular to the optical axis (z axis) of the quartz crystal. In the case of utilizing the coupling between F1 and T1, however, and of obtaining a very small sized resonator having an excellent f-T characteristic for a wristwatch, we found that it is undesirable to use the conventional cutting angle.

SUMMARY OF THE INVENTION

It is therefore an object of the present invention to provide an improved tuning fork type quartz crystal resonator having a very small size.

Another object of the invention is to provide an improved tuning fork type quartz crystal resonator having a structure which checks the vibration leakage.

A further object of the invention is to provide an improved tuning fork type quartz crystal resonator utilizing a coupling between F1 and T1.

A still further object of the invention is to provide an improved tuning fork type quartz crystal resonator having an excellent f-T characteristic which may be used for a yearly-rate-accuracy watch.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE INVENTION

Figure 5:
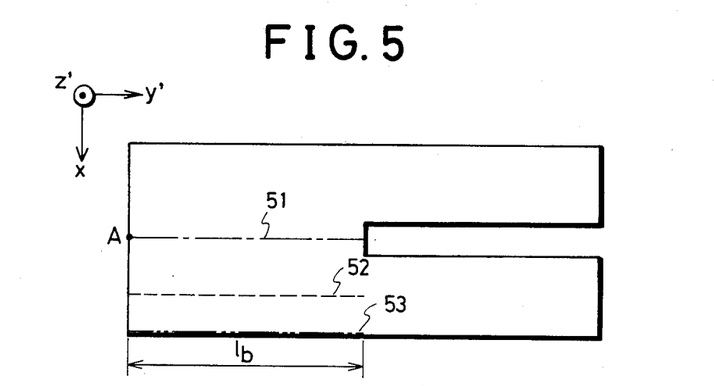
FIG. 5 is a plan view of a tuning fork type quartz crystal resonator.

A plan view of a tuning fork type quartz crystal resonator is shown in FIG. 5. In this figure, the axes x, y' and z' show the electrical mechanical and optical axes, respectively, with, the mechanical and optical axes being rotated through an angle around the electrical axis respectively.

$l_b$ shows the length of a base of a tuning fork type quartz crystal resonator. The reference numerals 51, 52 and 53 indicate three straight lines along the direction of the length of the base of the tuning fork type quartz crystal resonator. In case that a tuning fork type quartz crystal resonator has a flexural mode of vibration, the largest one of the three direction vibrating displacement factors in the base of resonator is $U_{y'}$ which is the displacement in the direction of the length.

In a conventional tuning fork type quartz crystal resonator which utilizes only a flexural mode, the ratio w/l of the width w to the length l of one tuning fork arm is about 0.1.

On this condition, the value of $U_{y'}$ in the base of a tuning fork type quartz crystal resonator is small, and it is seldom that the vibration energy of the resonator leaks out through the lead terminals. But if either $f_F$ is larger or the length of the tuning fork arm is smaller as when utilizing the coupling between F1 and T1, that is, the width-to-length ratio w/l is more than 0.1, the displacement $U_{y'}$ according to a flexural mode vibration in the base of a tuning fork type quartz crystal resonator is apt to be large.

Figure 6:
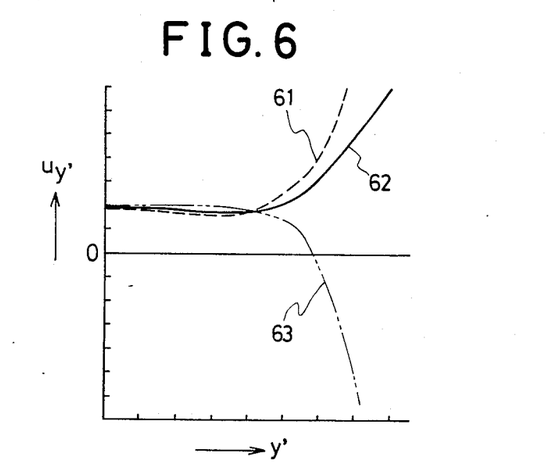
FIG. 6 is a graph showing the displacement $U_{y'}$ according to a flexural mode in the base of a tuning fork type quartz crystal resonator.

FIG. 6 is a graph showing $U_{y'}$ according to F1 along the three straight lines shown in FIG. 5 as determined by the Finite Element Method, in respect of a tuning fork type quartz crystal resonator having a width-to-length ratio w/l of about 0.3.

The curves of the reference numerals 61, 62 and 63 indicate $U_{y'}$ on the lines 51, 52 and 53 shown in FIG. 5 respectively.

Each of $U_{y'}$ of the three straight lines shown in FIG. 5, in the tail end region in the length direction of the base, is approximately equal to each other, as shown in FIG. 6.

The same relation would hold for resonators having a width-to-length ratio w/l of other values.

Accordingly, the difference between the base displacements of a plurality of resonators is nearly equal to the difference between displacements of the tail end portion A shown in FIG. 5.

Figure 7:
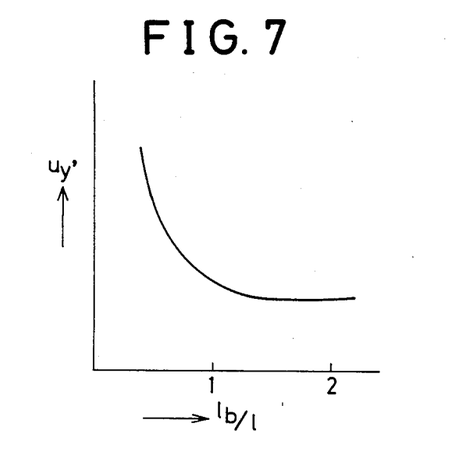
FIG. 7 is a graph showing the relation between the length of the base and the displacement $U_{y'}$ in the end region of the base.

FIG. 7 is a graph showing the relation between $U_{y'}$ which is the displacement in the length direction according to F1 of the resonator at the point A shown in FIG. 5 and the length of the base $l_b$, in the case of w/l being about 0.3. In FIG. 7, the vertical axis indicates $U_{y'}$ at the point A according to F1, and the horizontal axis indicates the width-to-length ratio w/l, where the length of the tuning fork arm l is constant.

As shown in FIG. 7, in the case that $l_b/l$ is smaller than 1, the displacement $U_{y'}$ becomes extremely large at the point A. When $l_b$ is larger than l, $U_{y'}$ becomes constant. As described above, in the case of a tuning fork type quartz crystal in which w/l is large, if the length of a base becomes larger than that of the tuning fork arms, the base displacement becomes smaller. In case of utilizing the coupling between the flexural and torsional modes, the length l needs to be made smaller, therefore the value of w/l becomes larger. The resonator of the invention utilizes the coupling between F1 and T1, however, the vibration mode of the resonator (hereinafter referred to as the main vibration mode) is F1 when the resonator is vibrating in a vibrating circuit. Therefore, it is necessary to make smaller $U_{y'}$ attributable to F1 at the tail end (lower end) of the base in the longitudinal direction which is a supporting portion, in order to check the vibration leakage.

In the vibrating displacements of the torsional mode in the base of the resonator, the displacement in the thickness direction $U_{z'}$ is the largest of the displacements of the length, the width and the thickness directions of the resonator.

The main mode of the resonator utilizing the coupling between the flexural and torsional modes is F1, however, F1 has the component of the vibrating displacements according to T1 because of the coupling between T1 and F1. Accordingly, so as to prevent vibration leackage of F1 which couples with T1, it is necessary to make the vibrating displacement, especially $U_{z'}$, attributable or due to T1 in the base of the resonator small.

Figure 8:
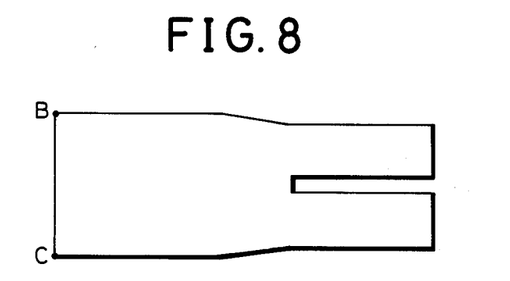
FIGS. 8 and 9 are plan views of tuning fork type quartz crystal resonators.
Figure 9:
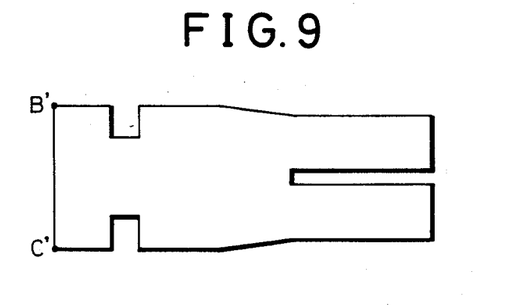

FIGS. 8 and 9 are plan views of tuning fork type quartz crystal resonators. The plane shapes of tuning fork type quartz crystal resonators shown in FIGS. 8 and 9 are much the same, except that the resonator shown in FIG. 9 has a base with a narrow width portion, which is provided at an intermediate position of the base between the upper and lower ends of the base.

Figure 10:
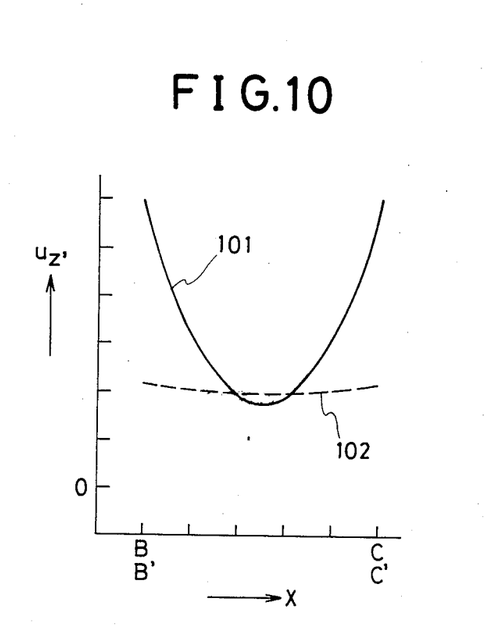
FIG. 10 is a graph showing the displacement $U_{z'}$ according to a torsional mode in the base ends of the resonator shown in FIGS. 8 and 9.

In FIG. 10, numeral 101 indicates $U_{z'}$ according to T1 on BC straight line which is the base end of the resonator shown in FIG. 8. And numeral 102 indicates $U_{z'}$ according to T1 on B'C' straight line which is the base end of the resonator shown in FIG. 9. In the embodiments of the resonators shown in FIGS. 8 and 9, both have a width-to-length ratio w/l of about 0.3, and both have a length of the base to the length of the tuning fork arm ratio $l_b/l$ of about 2. The results shown in FIG. 10 is obtained by the infinite Element Method.

As shown in FIG. 10, if the base of the resonator has a narrow width portion, the displacement $U_{z'}$ according to T1 at the base end becomes smaller compared with a resonator not having such a narrow width portion.

In the case the tuning fork type quartz crystal resonator with no narrow width portion shown in FIG. 8 vibrates in the torsional mode, $U_{z'}$ at both of the width ends of the base is very large, so that the width ends vibrate in the thickness direction.

However, in the case the tuning fork type quartz crystal resonator with a narrow width portion shown in FIG. 9 vibrates in the torsional mode, there is no vibration in the thickness direction at the base end is not found.

Figure 11:
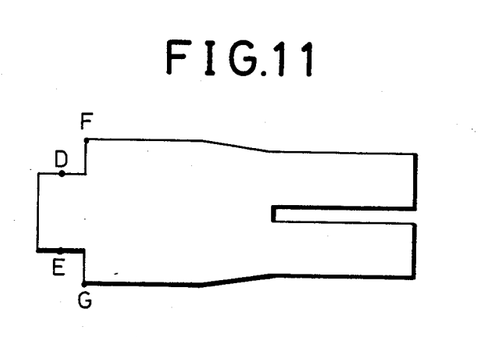
FIG. 11 is a plan view of a tuning fork type quartz crystal resonator.

FIG. 11 is a plan view of a tuning fork type quartz crystal resonator which has a narrow width portion at the longitudinal tail (lower) end of the base.

Figure 12:
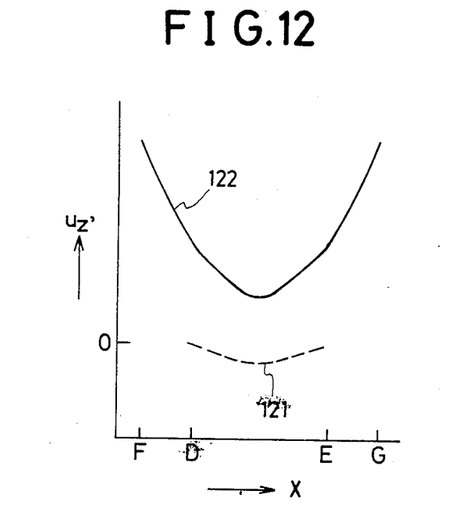
FIG. 12 is a graph showing the displacements $U_{z'}$ according to a torsional mode at four positions of the base of the resonator shown in FIG. 11.

The width-to-length ratio w/l in this resonator is about 0.3, and the length of the base to the length of the tuning fork arm ratio $l_b/l$ is about 2. FIG. 12 is a graph showing the displacements $U_{z'}$ in the thickness direction according to T1 on the straight line DE in the narrow width portion of the base and on the straight line FG.

The result shown in FIG. 12 is obtained by the Infinite Element Method. The reference numerals 121 and 122 indicate $U_{z'}$ on the line DE and on the line FG, respectively. As shown in FIG. 12, $U_{z'}$ on the line DE is very much smaller than $U_{z'}$ on the line FG.

Furthermore, the vibration on the line FG in the thickness direction which is characteristics of the torsional mode almost disappears on the line DE.

Accordingly, if the base of the resonator has a narrow width portion, at the longitudinal tail end, such has a good effect on making the displacement of vibration according to T1 small.

As described above, the narrow width portion provided everywhere of the base is effective to make the vibration displacement according to T1 in the end region of the base small. As a result, the displacement $U_{z'}$ according to F1 coupling with T1 at the base is small too. Therefore, the narrow width portion formed on the base effectively prevents vibration leakage of F1 coupling with T1.

Figure 13:
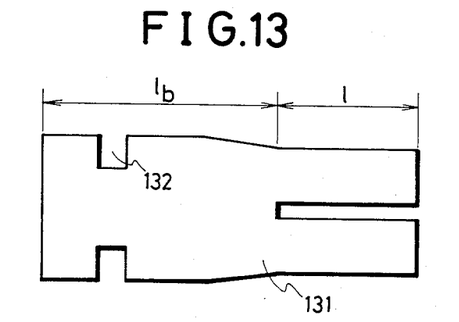
FIGS. 13 and 14 are plan views of tuning fork type quartz crystal resonators showing embodiments of the present invention.

FIG. 13 is a plan view showing an embodiment of a tuning fork type quartz crystal resonator according to the present invention. The reference numerals 131 and 132 indicate the tuning fork type quartz crystal resonator and the recess portion formed on the base, respectively. The length $l_b$ of the base is larger than the length l of the tuning fork arms.

Figure 14:
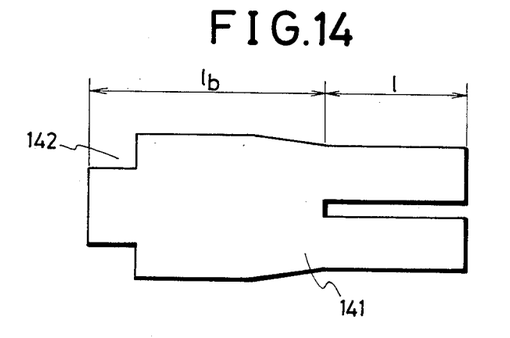

FIG. 14 is a plan view showing another embodiment of a tuning fork type quartz crystal resonator according to the present invention. The reference numerals 141 and 142 indicate the tuning fork type quartz crystal resonator and the recess portion formed on the longitudinal tail end of the base respectively. The length $l_b$ of the base is larger than the length l of the tuning fork arms.

We have produced a plurality of tuning fork type quartz crystal resonators as shown in FIGS. 13 and 14 having the width-to-length ratio w/l of 0.3 to 0.4 and $l_b/l$ of about 2. Each of the reasonators was mounted in a housing made of Iron Cobalt Alloy (KV.) The housing has a size of 1.5 mm diameter and 5 mm length. The resonators have vibrated with approximately no vibration leakage.

It is preferable to form the narrow width portion of the base having a width less than 4/5 of the width of the base, in order to lower the vibrating displacement of the tail base end effectively.

As described above, it is possible to make the displacement $U_{y'}$ of the base according to F1 small by making the length of the base $l_b$ larger than the length of tuning fork arms l.

Furthermore it is possible to make the displacement $U_{z'}$ of the base according to T1 small by forming a narrow width portion on the base. Consequently, it is possible to check the vibration leakage of F1 which is the main vibration mode.

The dimension and the cutting angle of the resonator utilizing the coupling between F1 and T1, which give the resonator excellent f-T characteristics, will become clear from the following description.

Figure 15:
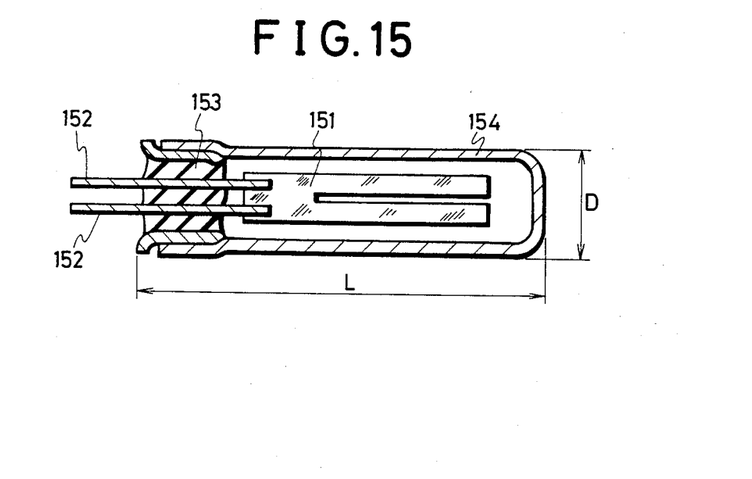
FIG. 15 is a partly sectional view showing a tuning fork type quartz crystal resonator enclosed in a housing.

FIG. 15 is a plan view showing a tuning fork type quartz crystal resonator enclosed in a housing. Reference numeral 151 indicates a tuning fork type quartz crystal resonator, 152 indicates lead terminals for applying an alternating voltage to a pair of exciting electrodes and for supporting the resonator, 153 indicates a plug, and 154 indicates a housing. The housing of the quartz crystal resonator for a wristwatch generally measures 1.5 mm to 2.0 mm in diameter D and 5 mm to 6 mm in length L, because of limitation in thickness and size of watches. For housing the resonator, the tuning fork type quartz crystal resonator is limited in size. Because of the limitation in diameter D of the housing, the width dimension w of one tuning fork arm of the resonator shown in FIG. 3 needs to be not more than about 0.5 mm. If w is more than 0.5 mm, the space between the inner wall of the housing and the resonator is too narrow, so that the resonator is apt to strike against the housing and to break when the resonator unit is jarred or dropped.

In order to improve make the f-T characteristic of the flexural mode by utilizing a coupling between two modes, it is necessary to give a proper value to the difference between the vibrational frequencies of the two modes (hereinafter referred to as $\delta_f$) because the strength of coupling between the two modes depends mainly on $\delta_f$. The frequency $f_T$ of the torsional mode is proportional to the thickness t of the resonator. If the thickness t varies by 1 $\mu$m, $f_T$ varies by about 2 KHz to 3 KHz. On the contrary, as the frequency $f_T$ of the flexural mode scarcely depends on the thickness t, if the thickness varies, $f_F$ does not vary widely. Therefore, since more than 99 resonators are produced out of a wafer of quartz crystal, if the thickness of the wafer is not uniform, the variation in $\delta_f$ of the resonators is wide, so each of the resonators has a different f-T characteristic from the other. It is necessary to control the variation in thickness in a wafer of quartz crystal to less than about 1 $\mu$m. In the present polishing technique, it is difficult to meet this requirement in the case of a too thin crystal quartz wafer, e.g., not more than 50 $\mu$m.

As stated above, when the tuning fork type quartz crystal resonator utilizing the coupling between F1 and T1 is used for a watch, it is desired that the width of one tuning fork arm is not more than 0.5 mm and the thickness of the resonator is not less than 50 $\mu$m (0.05 mm).

Watches need 1 Hz signals ultimately. In present watches, 1 Hz signals are produced by dividing the frequency of a quartz crystal resonator having a resonant frequency of 32,768 Hz which is $2^{15}$.

Therefore, in the case of using a tuning fork type quartz crystal resonator utilizing the coupling between F1 and T1 as a resonator for a watch, the frequency $f_F$ of the flexural mode which is the main mode of the resonator demands a multiple integer of 1/an integer of 32,768 Hz. The main mode means the vibrating mode after assembling the resonator in an oscillator circuit, which has a lower equivalent resistance $R_1$.

As mentioned before, in order to obtain a tuning fork type quartz crystal resonator having an excellent f-T characteristic by utilizing the coupling between flexural and torsional modes, it is necessary to satisfy the equation (3). According to equation (3), so as to obtain an excellent f-T characteristic, the values of $f_F$ and $f_T$ must be close to each other, and the optimum value of the difference $\delta_f$ between $f_F$ and $f_T$ is fixed. As $f_F$ is proportional to $w/l^2$ and $f_T$ is nearly proportional to t/lw, the relation between l, w and t is necessarily determined, when $f_F$ has a value which is a multiple integer or 1/an integer of 32,768 Hz.

That is, if l is fixed, w is necessarily determined in order to give $f_F$ a desired value, and t is necessarily determined in order to bring $f_T$ near to $f_F$ so that the f-T characteristic becomes better.

Figure 16:
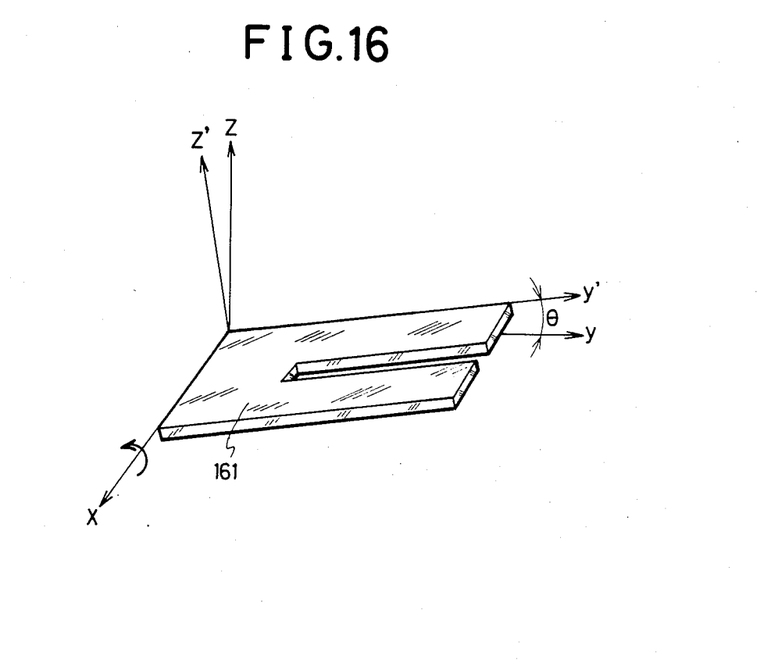
FIG. 16 is a perspective view showing a cutting angle of a tuning fork type quartz crystal resonator.

FIG. 16 is a perspective view showing the cutting angle of a tuning fork type quartz crystal resonator. Reference numeral 161 indicates a tuning fork type quartz crystal resonator. Axes x, y and z show the electrical axis, the mechanical axis and the optical axis of the quartz crystal, respectively. The tuning fork type quartz crystal resonator shown in FIG. 16 is produced by rotating the z plate, which is the plate perpendicular to the z axis, through an angle $\theta$ in the counterclockwise direction around the x axis, where y' and z', respectively, denote the length and thickness directions of the resonator.

Referring to the cutting angle $\theta$, a counterclockwise direction of rotation around the x axis is defined as a positive angle.

Figure 17:
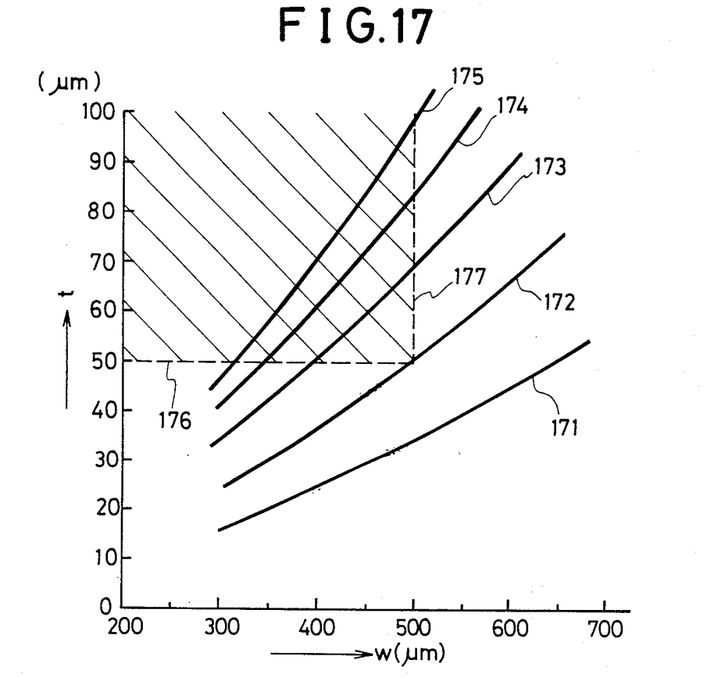
FIG. 17 is a graph showing the relation between the width w of one tuning fork arm and the thickness t of the resonator, in l, w and t which are necessarily determined so as to satisfy the equation (3), when the $f_F$ of the resonator, which utilizes the coupling between F1 and T1, has a value being a multiple integer of 32768 Hz.

FIG. 17 is a graph showing the relation between the width w of one tuning fork arm and the thickness t of the resonator, wherein l, w and t are necessarily determined so as to satisfy the equation (3), when the $f_F$ of the resonator, which utilizes the coupling between F1 and T1, has a value which is a multiple integer of 32,768 Hz. The curves of the reference numerals 171, 172, 173, 174 and 175 indicate the relations between t and w when the values of $f_F$ are 32,768 Hz, 65.5 KHz, 131.1 KHz, 196.6 KHz and 262.1 KHz respectively.

FIG. 17 is a graph in the case of the cutting angle being $-15°$. In the case of $\theta$ ranging from $-20°$ to $-10°$, the relationship shown in FIG. 17 holds true.

In FIG. 17, the broken-line 176 indicates the value of t=50 $\mu$m and 177 indicates the value of w=0.5 mm. In order to enclose the tuning fork type quartz crystal resonator in the housing, a combination of w and t of the resonator needs to be within the hatched area on the upside of the line 176 and on the left side of the line 177 in FIG. 17. As shown in FIG. 17, the curve 171 is not in said area. Therefore, in the case of $f_F$ being 32,768 Hz, it is not possible to enclose the resonator utilizing the coupling between F1 and T1 in the housing as shown in FIG. 15. In the case of $f_F$ being 65.5 KHz, it is narrowly possible to enclose the resonator in the housing as shown in FIG. 15 when the combination of w and t is slightly in the hatched area. That is, in order to use the tuning fork type quartz crystal resonator utilizing the coupling F1 and T1, as a resonator for a wristwatch, $f_F$ must be not less than 65 KHz.

Figure 18:
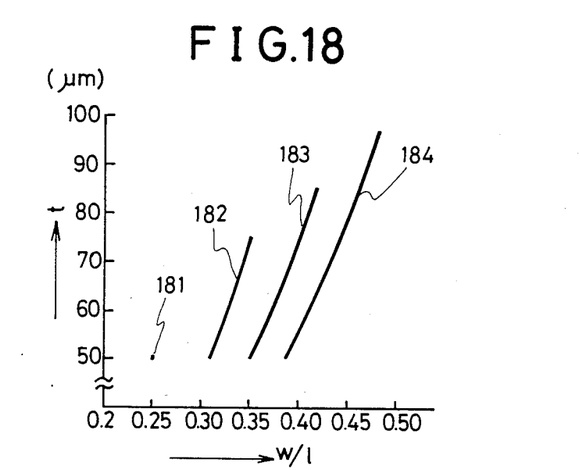
FIG. 18 is a graph showing the relation between t and w/l, in the combination of w and t which is in the area of the upside of the line 176 and on the left side of the line 177 in FIG. 17.

FIG. 18 is a graph showing the relation between t and w/l, for combinations of w and t which are in the hatched area on the upside of the line 176 and on the left side of the line 177 in FIG. 17.

Reference numerals 181, 182, 183 and 184 indicate the relation between t and w/l in the case of $f_F$ being 65.5 KHz, 131.1 KHz, 196.6 KHz and 262.1 KHz, respectively. The higher $f_F$ becomes, the larger w/l becomes. As shown in FIG. 18, in the case of using the tuning fork type quartz crystal resonator utilizing the coupling between F1 and T1 as a resonator for a wristwatch, the ratio w/l of the width w to the length l of one tuning fork arm needs to be not less than about 0.25.

The f-T characteristic may be shown in the equation as follows:

$$(f(T)-f(To))/f(To)=\alpha(T-To)+\beta(T-To)^2+\gamma(T-To)^3 \qquad (4)$$

where, f(T) is the frequency of the resonator at any temperature T, F(To) is the frequency at a standard temperature To, $\alpha$, $\beta$ and $\gamma$ are the first, second and third order frequency-temperature coefficients, respectively. As a standard temperature To, a temperature near the normal temperature, e.g., 20° C., is generally selected. The tuning fork type quartz crystal resonator used for a wristwatch generally utilizes only a flexural mode. In the case that $\alpha$ is zero, $\beta$ is not zero and has a minus value. Therefore the f-T characteristic shows a convex parabola in the upside. But in the case of the tuning fork type quartz crystal resonator utilizing the coupling between the flexural and torsional modes, both of $\alpha$ and $\beta$ vary to a plus value from minus a value as $f_T$ approaches $f_F$.

When $\delta_f$, that is, $f_F - f_T$ is a fixed value, $\alpha$ may be zero. But it is necessary that a cutting angle $\theta$ shown in FIG. 16 must be a proper value so that $\beta$ may be zero with $\alpha$.

If both of $\alpha$ and $\beta$ can be zero, the f-T characteristic is better than that of a quartz crystal resonator for a wristwatch which is in use today and it is possible to provide a quartz crystal resonator for a highly precise wristwatch having a yearly-rate-accuracy of about 10 seconds. It is said that both of $\alpha$ and $\beta$ being zero requires $\theta$ being between 0° and $-15°$.

We have found, however, that the tuning fork type quartz crystal resonator utilizing the coupling between F1 and T1 and having w/l value more than 0.25, does not require that $\theta$ have a value in the range of 0° to $-15°$. Conventional tuning fork type quartz crystal resonators utilizing the coupling between F2 and T1 have a w/l value of about 0.1 to 0.15.

Figure 19:
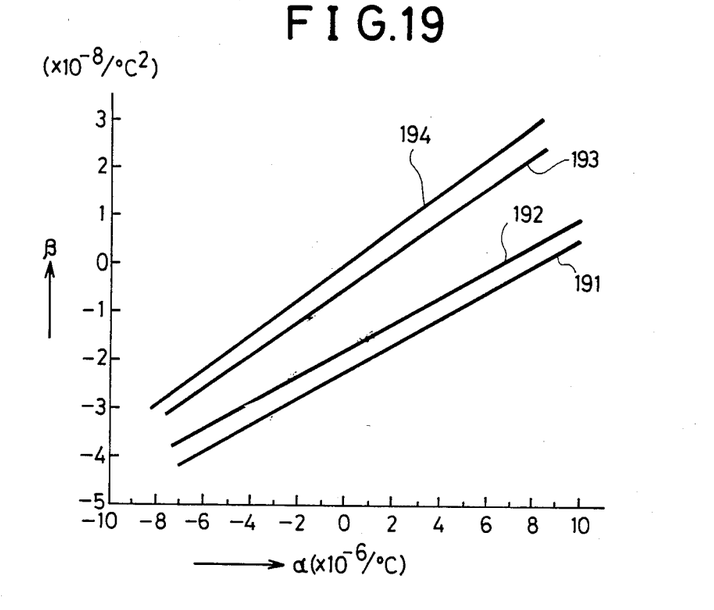
FIG. 19 is a graph showing the relation between $\alpha$ and $\beta$ of the resonator which utilizes the coupling between F1 and T1 for a plurality of cutting angles $\theta$.

FIG. 19 is a graph showing the relation between $\alpha$ and $\beta$ in the tuning fork type quartz crystal resonator utilizing the coupling between F1 and T1, for a plurality of cutting angles $\theta$. This graph is one in the case that $f_F$ is 196.6 KHz and w/l value is about 0.36.

The lines 191, 192, 193 and 194 indicate the relations between $\alpha$ and $\beta$ in respect to $\theta$ being $-10°$, $-12°$, $-15°$ and $-16°$, respectively.

Figure 20:
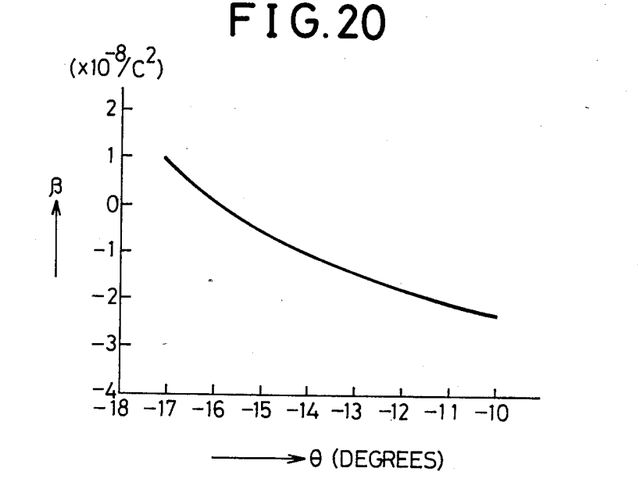
FIG. 20 is a graph showing the relation between $\beta$ and $\theta$, when $\alpha$ is zero.

FIG. 20, which is obtained from FIG. 19, is a graph showing the relation between $\beta$ and $\theta$ in the case of $\alpha$ being zero. Both of $\alpha$ and $\beta$ are zero in the case of $\theta$ being $-16°$, as shown in FIG. 20.

A highly precise watch having a yearly-rate-accuracy of about 10 seconds needs a resonator having f-T characteristics with $\beta$ having a absolute value of not more than $2 \times 10^{-8}$ in case of $\alpha$ being zero.

As shown in FIG. 20, in case of a tuning fork type quartz crystal resonator utilizing the coupling between F1 and T1 and having a width-to-length ratio w/l of about 0.36, the cutting angle $\theta$ is desired to be in the range from $-17°$ to $-12°$.

The cutting angle $\theta$ giving both of $\alpha$ and $\beta$ being zero depends on the w/l value. The w/l value of a tuning fork type quartz crystal resonator utilizing a coupling between F1 and T1 is large compared with the conventional resonator utilizing a coupling between flexural and torsional modes, more particularly between F2 and T1.

As described above, it is possible to make the tuning fork type quartz crystal resonator utilizing coupling between F1 and T1 small compared with the conventional resonator utilizing between F2 and T1.

The tuning fork type quartz crystal resonator of the present invention has stable electrical characteristics and stable frequency-aging characteristics in spite of the w/l value being large. This is because it has a shape or configuration effective to check the vibration leakage. Moreover, the resonator of the present invention has excellent frequency-temperature characteristics with both of $\alpha$ and $\beta$ being approximately zero. The resonator according to the invention utilizes a coupling between F1 and T1 and has excellent characteristics as a resonator for a highly accurate wristwatch.

What is claimed is:

1. A tuning fork type quartz crystal resonator utilizing a coupling between the fundamental flexural and fundamental torsional modes of vibration, said resonator comprising a base having head and tail ends and two tuning fork arms extending from the head end of said base, the length of said base between the head and tail ends thereof being larger than that of said tuning fork arms, said base having a relatively wide width portion near the tuning fork arms, and a relatively narrow width portion spaced from the tuning fork arms and being effective to lower the vibrating displacements of the tail end of the base attributable to torsional mode vibration.

2. A resonator as claimed in claim 1; wherein the base has a gradually widening width portion between the tuning fork arms and the relatively wide width portion.

3. A resonator as claimed in claim 1; wherein the width to length ratio w/l is not less than 0.25, where w is the width of one arm of the resonator and l is the length of the arm.

4. A resonator as claimed in claim 1; wherein the width w of one arm of the resonator is not more than 0.5 mm.

5. A resonator as claimed in claim 4; wherein the thickness of the resonator is not less than 50 $\mu$m.

6. A resonator as claimed in claim 1; wherein the width to length ratio w/l is in the range of 0.3 to 0.4, where w is the width of one arm of the resonator and l is the length of the arm.

7. A resonator as claimed in claim 1; wherein the resonator comprises a Z plate rotated by an angle less than $-12$ degrees around the electrical axis of the quartz crystal, where the positive angle is defined as an angle in the counterclockwise direction of rotation around the electrical axis.

8. A resonator as claimed in claim 3; wherein the resonator comprises a Z plate rotated by an angle less than $-12$ degrees around the electrical axis of the quartz crystal, where the positive angle is defined as an angle in the counterclockwise direction around the electrical axis.

9. A resonator as claimed in claim 6; wherein the resonator comprises a Z plate rotated by an angle of $-17$ to $-12$ degrees around the electrical axis of the quartz crystal.

10. A resonator as claimed in claim 1; wherein the relatively narrow width portion is located intermediate between the head and tail ends of the base.

11. A resonator as claimed in claim 1; wherein the relatively narrow width portion is located at the longitudinal tail end of the base.

12. A resonator as claimed in claim 1; wherein the width of the relatively narrow width portion is less than 4/5ths of the width of the base.

13. A tuning fork resonator comprising: a quartz crystal tuning fork having coupled together fundamental flexural and fundamental torsional modes of vibration, the tuning fork having a base having opposed head and tail ends, and two vibratable arms extending outwardly from the base head end, the length of the base from the head end thereof to the tail end thereof being longer than the length of the tuning fork arms, the base having along its length a relatively wide width portion and a relatively narrow width portion, the relatively narrow width portion being spaced from the base head end and being positioned and dimensioned to lower the vibrating displacements of the base tail end attributable to fundamental torsional mode vibrations to thereby reduce the leakage of vibrational energy from the base during use of the tuning fork resonator.

14. A tuning fork resonator according to claim 13; wherein the base has a gradually tapered width portion interposed between the relatively wide width portion and the tuning fork arms, the gradually tapered width portion having a wider end connected to the relatively wide width portion and gradually tapering in the lengthwise direction of the base to a narrower end connected to the tuning fork arms.

15. A tuning fork resonator according to claim 14; wherein the tuning fork arms have a width-to-length ratio w/l not less than 0.25, where w represents the width dimension of the tuning fork arms and l represents the length of the tuning fork arms.

16. A tuning fork resonator according to claim 15; wherein the relatively narrow width portion is positioned at the base tail end.

17. A tuning fork resonator according to claim 16; wherein the tuning fork arms have a width-to-length ratio of 0.36.

18. A tuning fork resonator according to claim 16; wherein the width of each tuning fork arm is not more than 0.5 mm.

19. A tuning fork resonator according to claim 18; wherein the thickness of the resonator is not less than 50 $\mu$m.

20. A tuning fork resonator according to claim 16; wherein the tuning fork comprises a quartz crystal z-plate rotated through an angle of $-17$ to $-12$ degrees about the electrical axis of the quartz crystal, the negative angle driection being defined as the clockwise direction of rotation about the electrical axis.

21. A tuning fork resonator according to claim 14; wherein the relatively narrow width portion is positioned between the tail end of the base and the tapered width portion of the base.

22. A tuning fork resonator according to claim 21; wherein the tuning fork arms have a width-to-length ratio w/l not less than 0.25, where w represents the width dimension of the tuning fork arms and l represents the length of the tuning fork arms.

23. A tuning fork resonator according to claim 22; wherein the width of each tuning fork arm is not more than 0.5 mm.

24. A tuning fork resonator according to claim 23; wherein the thickness of the resonator is not less than 50 $\mu$m.

25. A tuning fork resonator according to claim 21; wherein the tuning fork comprises a quartz crystal z-plate rotated through an angle of $-17$ to $-12$ degrees about the electrical axis of the quartz crystal, the negative angle direction being defined as the clockwise direction of rotation about the electrical axis.

* * * * *